(12) United States Patent
Zhou et al.

(10) Patent No.: US 10,854,820 B2
(45) Date of Patent: Dec. 1, 2020

(54) BLUE ORGANIC ELECTROLUMINESCENT DEVICE AND PREPARATION METHOD THEREOF

(71) Applicant: Changchun Institute of Applied Chemistry Chinese Academy of Sciences, Changchun (CN)

(72) Inventors: Liang Zhou, Changchun (CN); Hongjie Zhang, Changchun (CN); Xuesen Zhao, Changchun (CN)

(73) Assignee: Changchun Institute of Applied Chemistry Chinese Academy of Sciences, Changchun (CN)

( * ) Notice: Subject to any disclaimer, the term of this patent is extended or adjusted under 35 U.S.C. 154(b) by 0 days.

(21) Appl. No.: 16/477,282

(22) PCT Filed: Aug. 18, 2017

(86) PCT No.: PCT/CN2017/098005
§ 371 (c)(1),
(2) Date: Jul. 11, 2019

(87) PCT Pub. No.: WO2018/129921
PCT Pub. Date: Jul. 19, 2018

(65) Prior Publication Data
US 2020/0035926 A1 Jan. 30, 2020

(30) Foreign Application Priority Data
Jan. 16, 2017 (CN) .......................... 2017 1 0032259

(51) Int. Cl.
*H01L 51/56* (2006.01)
*H01L 51/50* (2006.01)
*H01L 51/00* (2006.01)

(52) U.S. Cl.
CPC ...... *H01L 51/0052* (2013.01); *H01L 51/0071* (2013.01); *H01L 51/5012* (2013.01);
(Continued)

(58) Field of Classification Search
CPC ............. H01L 51/0052; H01L 51/0069; H01L 51/5012
See application file for complete search history.

(56) References Cited

U.S. PATENT DOCUMENTS

| | | | |
|---|---|---|---|
| 2005/0112404 A1* | 5/2005 | Hamada | H01L 51/5036 428/690 |
| 2005/0118456 A1 | 6/2005 | Hamada et al. | |
| 2011/0291082 A1 | 12/2011 | Terao et al. | |
| 2017/0352824 A1* | 12/2017 | Zhou | H01L 51/0089 |

FOREIGN PATENT DOCUMENTS

| | | |
|---|---|---|
| CN | 1606393 | 4/2005 |
| CN | 101126020 | 2/2008 |

(Continued)

OTHER PUBLICATIONS

International Sear Report corresponding to International Application No. PCT/CN2017/098005, dated Oct. 24, 2017 (4 pages with English translation).
(Continued)

*Primary Examiner* — Daniel P Shook
(74) *Attorney, Agent, or Firm* — Myers Bigel, P.A.

(57) ABSTRACT

The present disclosure provides a blue organic electroluminescent device comprising: a substrate; an anode layer disposed on the substrate; a light emitting layer disposed on the anode layer, the light emitting layer being formed from a blue organic fluorescent material and a hole-type organic host material, wherein the blue organic fluorescent material is 8.0% to 25.0% by mass of the hole-type organic host material; and a cathode layer disposed on the light emitting layer.

11 Claims, 3 Drawing Sheets

(52) U.S. Cl.
CPC .......... *H01L 51/5024* (2013.01); *H01L 51/56* (2013.01); *H01L 51/5004* (2013.01)

(56) References Cited

FOREIGN PATENT DOCUMENTS

| CN | 102024909 | A | * | 4/2011 |
|---|---|---|---|---|
| CN | 102024909 | A | | 4/2011 |
| CN | 102738414 | A | | 10/2012 |
| CN | 106803542 | | | 6/2017 |
| WO | 2015167199 | A1 | | 11/2015 |

OTHER PUBLICATIONS

Extended European Search Report corresponding to EP 17891195.4; dated Sep. 16, 2020 (10 pages).

Ji et al. "Influence of doped materials on the performance of blue organic electroluminescent devices"J of Functional Materials and Devices, 12(2):125-129 (2006).

Li et al. "Blue Organic Light-emitting Diode Using ADN:TBPe as Light-emitting Layer"Chinese Journal of Liquid Crystals and Displays, 22(5):520-523 (2007).

Okumoto et al. "Green fluorescent organic light-emitting device with external quantum efficency of nearly 10%"Applied Physics Letters, 89: 063504 (2006) (3 pages).

Wang et al "High-efficiency blue-fluorescence N-BDAVBI-based organic light-emitting device with doubles emission layers"J of Optoelectronics Laser, 24(3):445-450 (2013).

Yao et al. "Blue Organic Light-Emitting Device Based on Dopant TBP"Chinese Journal of Liquid Crystals and Displays, China, 25(3):375-378 (2010).

Chinese Office Action corresponding to CN 201710032259.8; dated Aug. 31, 2018 (12 pages, including English translation).

Chinese Office Action corresponding to CN 201710032259.8; dated Dec. 4, 2017 (14 pages, including English translation).

* cited by examiner

BLUE ORGANIC ELECTROLUMINESCENT DEVICE AND PREPARATION METHOD THEREOF

CROSS REFERENCE TO RELATED APPLICATION

The present application is a 35 U.S.C. § 371 national phase application of International Application Serial No. PCT/CN2017/098005, filed Aug. 18, 2017, which claims a priority benefit of Chinese Patent Application No. 201710032259.8, filed on Jan. 16, 2017, with a title of "Blue organic electroluminescent device and preparation method thereof", the entirety of which is incorporated herein by reference. The above-referenced PCT International Application was published in the Chinese language as International Publication No. WO 2018/129921 on Jul. 19, 2018.

TECHNICAL FIELD

The present disclosure relates to the technical field of organic electroluminescence, and particularly to a blue organic electroluminescent device and a preparation method thereof.

BACKGROUND

An organic luminescent device is a device which spontaneously emits light. When charges are injected into an organic film between an electron injection electrode (an anode) and a hole injection electrode (a cathode), electrons and holes are combined and then annihilated to produce light. As compared to other flat display technologies such as liquid crystal display, plasma display device and field emission display, organic electroluminescent display has a series of excellent properties such as tunable luminescence color, active luminescence, high brightness, high efficiency, wide view angle, low energy consumption, simple preparation process, capability of preparing curved and flexible display screen, and so on, and has a wide application prospect in the field of large planar flat panel full color display, so it is considered as the most competitive new generation display technology. Therefore, research on organic electroluminescent technology has attracted more and more attentions and active participation of scientists and technicians in scientific community and industry community, such that the performances of organic electroluminescent device have been developed rapidly over the past decade. Among others, blue organic electroluminescent devices have become hot spots of investigation due to the wide prospect for application in terms of monochrome display, white light modulation, or the like.

R&D (Research and Development) and design of high performance and high quality pure blue organic electroluminescent device have always been key and difficult point in the field. Transition metal complexes are regarded as ideal organic electroluminescent material by the academic community and industry community, due to their advantages such as high luminescence efficiency, tunable luminescence color, and so on. Many research groups, both domestic and abroad, set about material synthesis and device optimization, trying to improve the overall performances of blue organic electroluminescent devices in order to satisfy the requirements for industrialization. However, blue organic electroluminescent devices obtained based on transition metal complexes are usually accompanied by low color purity, low operating life, or low luminescence efficiency. Therefore, more and more research groups tend to replace blue transition metal complexes with blue fluorescence luminescent materials to obtain pure blue fluorescence organic electroluminescent devices. However, pure blue fluorescent materials generally have low luminescence efficiency. In addition, relatively wide energy gap of pure blue fluorescent materials results in great inconvenience for the screening of host materials, finally leading to unbalanced injection, transport and distribution of carriers. As a result, the blue luminescent devices prepared have relatively low luminescence efficiency and relatively high operation voltage.

In order to solve these problems, domestic and abroad research groups devote themselves to design of new pure blue luminescent material and optimization of blue luminescent device structure. For example, Liang ZHOU et al. at Changchun Institute of Applied Chemistry, Chinese Academy of Sciences published a research article in Journal of Luminescence in 2010, which reported that a relatively stable pure blue luminescent device was obtained by incorporating trace amount of 8-hydroxylquinoline aluminum (AlQ), an electron transport material, into N,N'-di(1-naphthyl)-N,N'-diphenyl-1,1'-biphenyl-4,4'-diamine (NPB), a hole transport material emitting pure blue light. However, the device obtained had low luminescence efficiency, limiting its wide application in lighting and display fields. In 2014, Yuguang M A et al. at South China University of Technology reported in Laser Photonics Reviews that a new deep blue fluorescent material was developed and an excellent deep blue luminescent device was obtained. Although the deep blue device obtained had very excellent color purity and color stability, the high operation voltage thereof not only directly resulted in low power efficiency of the device, but also indirectly reduced the operation stability of the device. Thus, the overall performances of pure blue organic electroluminescent device comprising color purity, luminescence efficiency, operation stability and so on have not been substantially improved yet.

SUMMARY

In view of the above, the technical problem to be solved by the present disclosure is to provide a blue organic electroluminescent device and a preparation method thereof. The blue organic electroluminescent device has simple structure, and relatively high efficiency, luminance and operation stability.

The present disclosure provides a blue organic electroluminescent device, comprising:

a substrate;

an anode layer disposed on the substrate;

a light emitting layer disposed on the anode layer, the light emitting layer being formed from a blue organic fluorescent material and a hole-type organic host material, wherein the blue organic fluorescent material is 8.0% to 25.0% by mass of the hole-type organic host material, and an excited state energy of the blue organic fluorescent material is lower than an excited state energy of the hole-type organic host material; and a cathode layer disposed on the light emitting layer.

Preferably, the blue organic fluorescent material is 2,2'-(9,10-anthracenediyl-di-4,1-phenylene)bis[6-methyl-benzothiazole].

Preferably, the hole-type organic host material is one or more selected from the group consisting of 4,4'-di(9-carbazolyl)biphenyl, 1,3-di(carbazol-9-yl)benzene, 9,9'-(5-(triphenylsilyl)-1,3-phenylene)-bis-9H-carbazole, 1,3,5-tri(9-carbazolyl)benzene, 4,4',4"tri(carbazol-9-yl)triphenylamine and 4,4'-bis(triphenylsilyl)biphenyl.

Preferably, the light emitting layer has a thickness of from 5 to 20 nm.

Preferably, an anode interface layer is further disposed between the anode layer and the light emitting layer, wherein the anode interface layer has a thickness of from 2 to 10 nm.

Preferably, a hole transport layer or electron blocking layer is further disposed between the anode layer and the light emitting layer, wherein the hole transport layer or electron blocking layer has a thickness of from 40 to 60 nm. In the presence of the anode interface layer, the hole transport layer or electron blocking layer is disposed between the anode interface layer and the light emitting layer.

Preferably, a hole blocking layer or electron transport layer is further disposed between the light emitting layer and the cathode layer, wherein the hole blocking layer or electron transport layer has a thickness of from 40 to 60 nm.

Preferably, a buffer layer is further disposed between the hole blocking layer or electron transport layer and the cathode layer, wherein the buffer layer has a thickness of from 0.8 to 1.2 nm.

The present disclosure further provides a preparation method of a blue organic electroluminescent device, comprising:

forming an anode layer on a substrate;

forming a light emitting layer on the anode layer, the light emitting layer being formed from a blue organic fluorescent material and a hole-type organic host material, wherein the blue organic fluorescent material is 8.0% to 25.0% by mass of the hole-type organic host material, and an excited state energy of the blue organic fluorescent material is lower than an excited state energy of the hole-type organic host material; and forming a cathode on the light emitting layer, thereby obtaining the blue organic electroluminescent device.

The present disclosure provides a blue organic electroluminescent device comprising: a substrate; an anode layer disposed on the substrate; a light emitting layer disposed on the anode layer, the light emitting layer being formed from a blue organic fluorescent material and a hole-type organic host material, wherein the blue organic fluorescent material is 8.0% to 25.0% by mass of the hole-type organic host material, and an excited state energy of the blue organic fluorescent material is lower than an excited state energy of the hole-type organic host material; and a cathode layer disposed on the light emitting layer. As compared to prior art, a blue organic fluorescent material with an excited state energy lower than that of the hole-type organic host material is used as luminescent material in the present disclosure, the blue organic fluorescent material having both high luminescence efficiency and high color purity as well as good thermostability, such that the color purity and efficiency of the device can be ensured. Meanwhile, the blue organic fluorescent material also has excellent electron transport capability, and as it is doped in the light emitting layer at a high concentration, the blue organic fluorescent material can function as both a host material and a blue luminescent material, which is beneficial for balancing the distribution of holes and electrons in the light emitting region, can confine the recombination of holes and electrons within the narrow region of the light emitting layer, and can effectively balance the distribution of carriers in the light emitting layer. In addition, the device provided in the present disclosure has simple structure and low cost, and all materials thereof have good thermostability, which is beneficial for improving the lifetime of the device.

DETAILED DESCRIPTION

Figure 1:
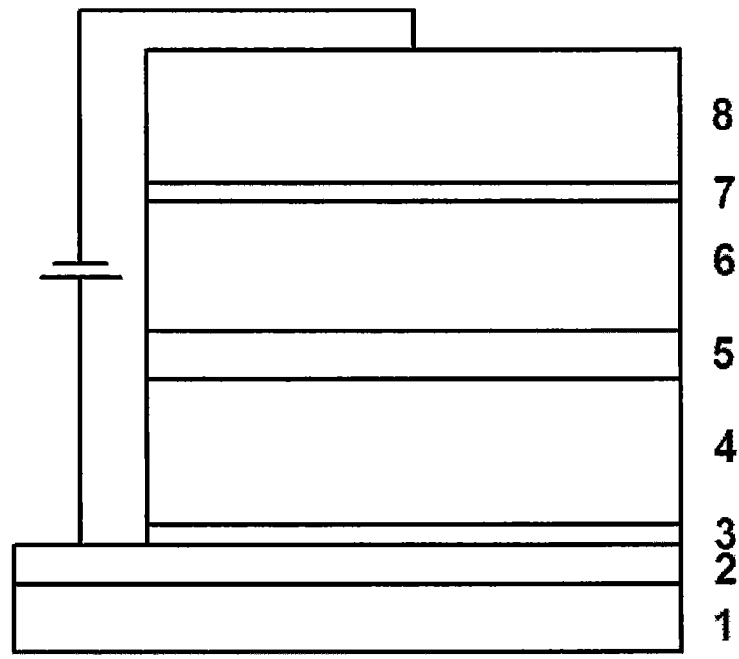
FIG. 1 is a schematic structural diagram of a blue organic electroluminescent device provided in the present disclosure.

The technical solutions in embodiments of the present disclosure will be detailedly described below in combination with the embodiments of the present disclosure. Obviously, the embodiments described are only a part of, not all of the embodiments of the present disclosure. All of other embodiments obtained by those skilled in the art based on the embodiments of the present disclosure, without inventive efforts, fall within the protection scope of the present disclosure.

The present disclosure provides a blue organic electroluminescent device, comprising:

a substrate;

an anode layer disposed on the substrate;

a light emitting layer disposed on the anode layer, the light emitting layer being formed from a blue organic fluorescent material and a hole-type organic host material, wherein the blue organic fluorescent material is 8.0% to 25.0% by mass of the hole-type organic host material, and an excited state energy of the blue organic fluorescent material is lower than an excited state energy of the hole-type organic host material; and a cathode layer disposed on the light emitting layer.

There are no particular requirements on the substrate in the present disclosure, as long as it is a well-known substrate for those skilled in the art. The substrate is preferably a plastic substrate, a polymer substrate, a silicon-based substrate or a glass substrate, and more preferably a glass substrate.

An anode layer is disposed on the substrate. The anode layer is formed from a material into which holes can be easily injected, preferably a conductive metal, a conductive metal oxide, or graphene, more preferably indium tin oxide, gold electrode, platinum electrode or graphene electrode, and still more preferably indium tin oxide. The indium tin oxide preferably has a surface resistance of 8 to 25 ohm.

According to the present disclosure, an anode interface layer is preferably further disposed on the anode layer. The anode interface layer preferably has a thickness of 2 to 10 nm, more preferably 2 to 8 nm, still more preferably 2 to 5 nm, and the most preferably 3 nm. The anode interface layer is not specifically limited, as long as it is a well-known anode interface layer for those skilled in the art. In the present disclosure, the anode interface layer is preferably molybdenum trioxide, lithium fluoride or sodium chloride.

In order to improve hole transport capability and meanwhile block electron transport so as to reduce the loss of the device and improve the efficiency of the device, a hole transport layer or electron blocking layer is preferably disposed on the anode interface layer. The hole transport layer or electron blocking layer preferably has a thickness of 40 to 60 nm, and more preferably 40 to 50 nm. The hole transport layer or electron blocking layer is not specifically limited, as long as it is a well-known hole transport layer or electron blocking layer for those skilled in the art. In the present disclosure, the hole transport layer or electron blocking layer is preferably formed from one or more selected from the group consisting of 4,4'-cyclohexylidene-bis[N,N-bis(4-methylphenyl)aniline] (TAPC), 4,4'-bis[N-(m-tolyl)-N-phenyl-amino]biphenyl (TPD) and N,N'-di(1-naphtyl)-N,N-diphenyl-1,1'-biphenyl-4,4'-diamine (NPB), the molecular structural formulae of which are shown as follows:

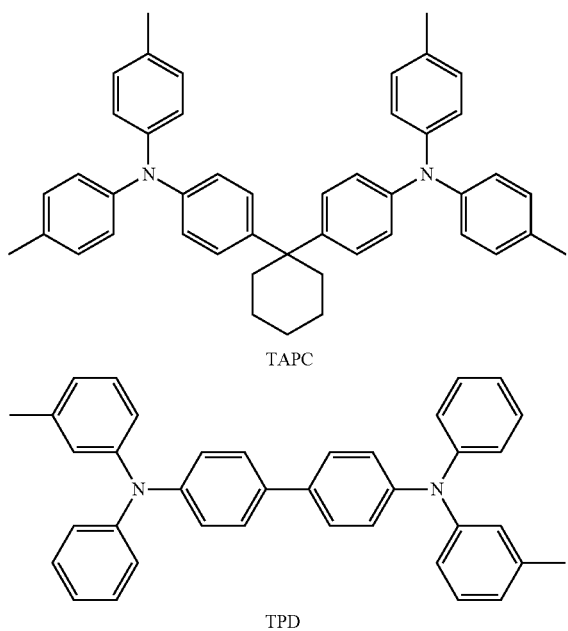

TAPC

TPD

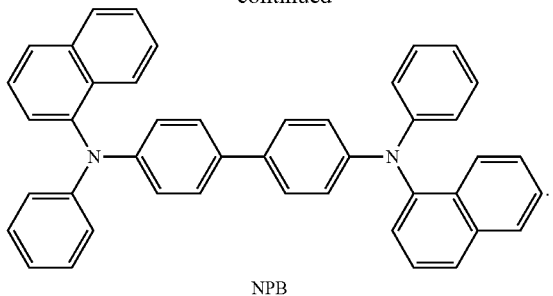

NPB

A light emitting layer is disposed on the hole transport layer or electron blocking layer. The light emitting layer is formed from a blue organic fluorescent material and a hole-type organic host material. The light emitting layer preferably has a thickness of 5 to 20 nm, more preferably 5 to 15 nm, still more preferably 8 to 12 nm, and the most preferably 10 nm. The blue organic fluorescent material is 8.0% to 25.0%, preferably 10.0% to 25.0%, more preferably 15.0% to 20.0%, and even more preferably 15.0% to 16.0% by mass of the hole-type organic host material. The blue organic fluorescent material is a blue organic fluorescent material with matched energy and energy level. The blue organic fluorescent material is not specifically limited, as long as it is a well-known blue organic fluorescent material with matched energy and energy level for those skilled in the art. One basic principle for energy matching is that energy can be effectively transferred from the host material to the luminescent material, which requires that the excited state energy of the host material is greater than the excited state energy of the luminescent material. One basic principle for energy level matching is that the host material has a wide energy gap, which can effectively include the energy gap of the luminescent material so as to facilitate capture of carriers. In the present disclosure, the blue organic fluorescent material should have an energy level favorable for electron injection into the light emitting region, and meanwhile function as an electron-type auxiliary host material. Therefore, in the present disclosure, the blue organic fluorescent material is preferably 2,2'-(9,10-anthracenediyl-di-4,1-phenylene)bis[6-methyl-benzothiazole] (DBzA, with a molecular formula as shown in formula I). The blue organic fluorescent material DBzA is selected as the luminescent material, as it has both high luminescence efficiency and high color purity as well as good thermostability, and meanwhile has excellent electron transport capability, capable of effectively balancing the distribution of carriers in the light emitting layer. The hole-type organic host material is not specifically limited, as long as it is a well-known hole-type organic host material for those skilled in the art. In the present disclosure, the hole-type organic host material is preferably 4,4'-di(9-carbazolyl)biphenyl (CBP, with a molecular formula as shown in formula II), 1,3-di(carbazol-9-yl)benzene (mCP, with a molecular formula as shown in formula III), 9,9'-(5-(triphenylsilyl)-1,3-phenylene)bis-9H-carbazole (SimCP, with a molecular formula as shown in formula IV), 1,3,5-tri(9-carbazolyl)benzene (TCP, with a molecular formula as shown in formula V), 4,4',4''tri(carbazol-9-yl)triphenylamine (TcTa, with a molecular formula as shown in formula VI) and 4,4'-bis(triphenylsilyl)biphenyl (BSB, with a molecular formula as shown in formula VII).

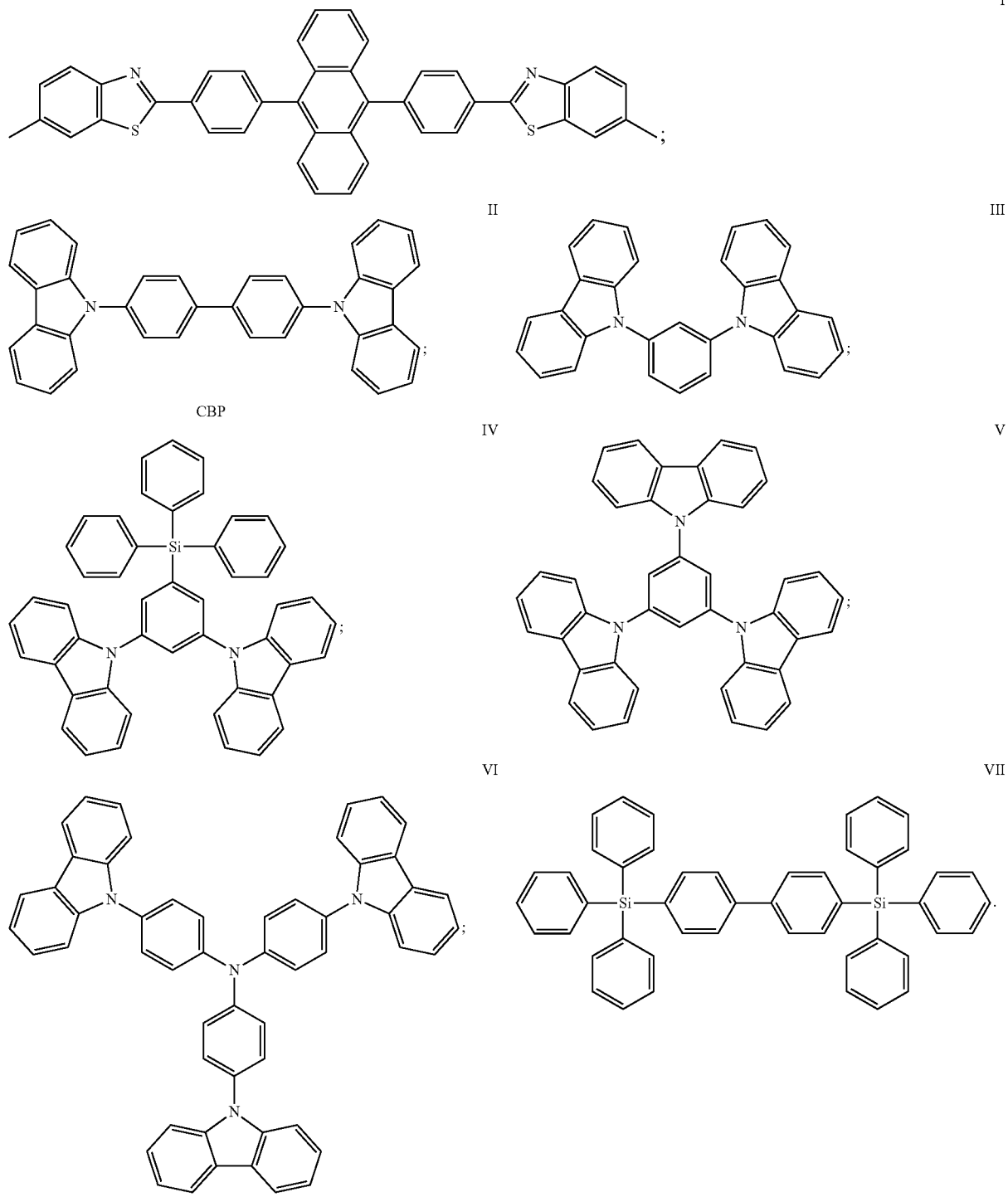

In order to improve electron transport capability and meanwhile block hole transport so as to reduce the loss of the device and improve the efficiency of the device, a hole blocking layer or electron transport layer is preferably further disposed on the light emitting layer. The hole blocking layer or electron transport layer preferably has a thickness of 40 to 60 nm, more preferably 40 to 55 nm, and still more preferably 40 to 50 nm. The hole blocking layer or electron transport layer is not specifically limited, as long as it is a well-known hole blocking layer or electron transport layer for those skilled in the art. In the present disclosure, the hole blocking layer or electron transport layer is preferably formed from one or more selected from the group consisting of tris[2,4,6-trimethyl-3-(3-pyridyl)phenyl]borane (3TP-YMB), 1,3,5-tri[(3-pyridyl)-3-phenyl]benzene (TmPyPB), 1,3-bis[3,5-di(3-pyridyl)phenyl]benzene (BmPyPhB), 1,3,5-tris(1-phenyl-1H-benzoimidazol-2-yl)benzene (TPBi) and 1,3,5-tris{6-[3-(pyridin-3-yl)phenyl]pyridin-2-yl}benzene (Tm3PyP26PyB), the molecular formulae of which are as shown in formulae VIII, IX, X, XI and XII.

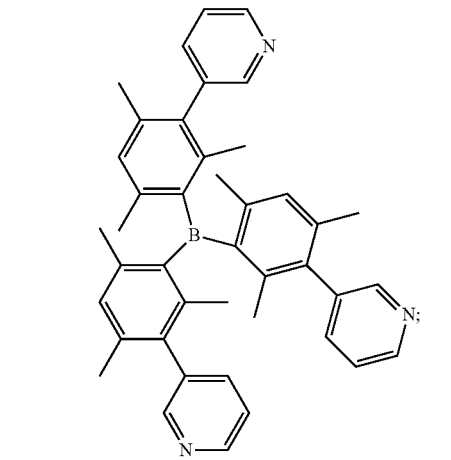

VIII

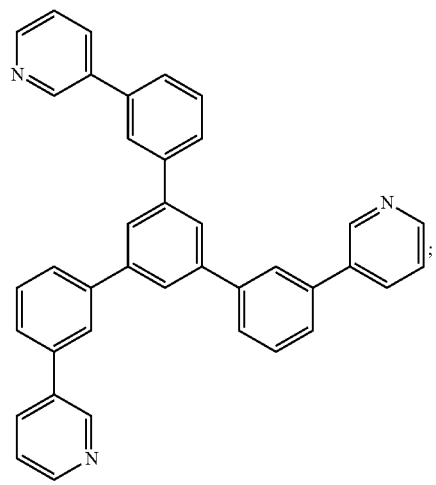

IX

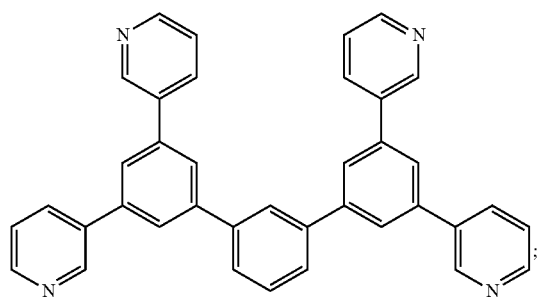

X

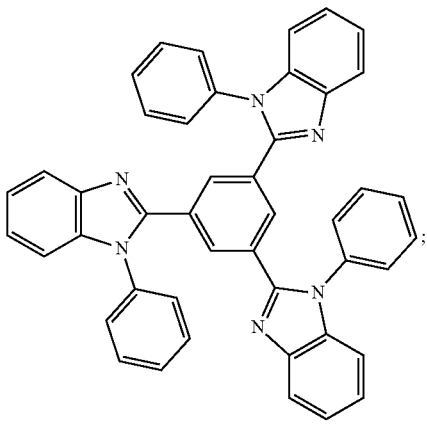

XI

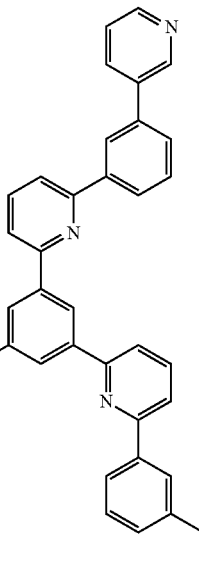

XII

In order to increase the electron injection efficiency to further improve the efficiency of the device, a buffer layer is preferably further disposed on the hole blocking layer or electron transport layer. The buffer layer preferably has a thickness of 0.8 to 1.2 nm, more preferably 0.9 to 1.1 nm, and still more preferably 1 nm. The buffer layer is not specifically limited, as long as it is a well-known buffer layer for those skilled in the art. In the present disclosure, the buffer layer is preferably formed from lithium fluoride, sodium chloride or sodium carbonate.

A cathode layer is disposed on the buffer layer. The cathode layer preferably has a thickness of 90 to 150 nm, more preferably 100 to 140 nm, still more preferably 110 to 130 nm, and the most preferably 120 nm. The cathode layer is not specifically limited, as long as it is a well-known cathode layer for those skilled in the art. In the present disclosure, the cathode layer is preferably formed from metal aluminum, magnesium silver alloy or silver.

A schematic structural diagram of the blue organic electroluminescent device provided in the present disclosure is as shown in FIG. 1; wherein 1 represents a substrate, 2 represents an anode layer, 3 represents an anode interface layer, 4 represents a hole transport layer/electron blocking layer, 5 represents a light emitting layer, 6 represents a hole blocking layer/electron transport layer, 7 represents a buffer layer, and 8 represents a cathode layer. The anode and the cathode of the blue organic electroluminescent device are overlapped with each other to form a light emitting region. When a positive voltage is applied between these two electrodes, the device will emit a pure blue light with a main emission peak around 462 nm.

In the present disclosure, a blue organic fluorescent material with an excited state energy lower than that of hole-type organic host material is used as a luminescent material, wherein the blue organic fluorescent material has both high luminescence efficiency and high color purity as well as good thermostability. As a result, the color purity and efficiency of the device can be ensured. Meanwhile, the blue organic fluorescent material also has excellent electron transport capability, and as it is doped in the light emitting layer at a high concentration, the blue organic fluorescent material can function as both a host material and a blue luminescent material, which is beneficial for balancing the distribution of holes and electrons in the light emitting region, can confine the recombination of holes and electrons within the narrow region of the light emitting layer, and can effectively balance the distribution of carriers in the light emitting layer. In addition, the device provided in the present disclosure has simple structure and low cost, and all materials thereof have good thermostability, which is beneficial for improving the lifetime of the device.

The present disclosure also provides a preparation method of the above blue organic electroluminescent device, comprising the following steps:

forming an anode layer on a substrate;

forming a light emitting layer on the anode layer, the light emitting layer being formed from a blue organic fluorescent material and a hole-type organic host material, wherein the blue organic fluorescent material is 8.0% to 25.0% by mass of the hole-type organic host material, and an excited state energy of the blue organic fluorescent material is lower than an excited state energy of the hole-type organic host material; and forming a cathode on the light emitting layer, thereby obtaining a blue organic electroluminescent device.

According to the present disclosure, an anode layer is firstly formed on a substrate. The substrate and the anode layer are as described above, and will not be reiterated here. In the present disclosure, the electrode is preferably obtained by etching the conductive metal, conductive metal oxide, or graphene on the substrate. The shape and size of the electrode formed by etching are not specifically limited in the present disclosure. For example, a strip electrode with a width of 10 mm and a length of 30 mm may be formed by etching.

Then, an anode interface layer is preferably formed on the anode layer. The anode interface layer is as described above and will not be reiterated here. In the present disclosure, preferably, the substrate with the anode layer formed thereon is washed and dried, and then the anode interface layer is formed on the anode layer. The process for forming the anode interface layer is not specifically limited, as long as it is a well-known process for those skilled in the art. In the present disclosure, preferably, the dried substrate with the anode layer formed is firstly subjected to a low pressure oxygen plasma treatment under vacuum condition, and then the anode interface layer is vapor deposited thereon. The vacuum degree for the vacuum condition is preferably 8 to 15 Pa. The voltage for the low pressure oxygen plasma treatment is 350 to 500 V. The time for the low pressure oxygen plasma treatment is preferably 5 to 15 min. The vacuum degree for the vapor deposition is preferably $5\times10^{-5}$ to $8\times10^{-5}$ Pa.

Then, a hole transport layer or electron blocking layer is preferably formed on the anode interface layer. The hole transport layer or electron blocking layer is as described above and will not be reiterated here. The forming process is not specifically limited, as long as it is a well-known process for those skilled in the art. In the present disclosure, the process is preferably a vacuum vapor deposition process. The vacuum degree for the vapor deposition is preferably $1\times10^{-5}$ to $3\times10^{-5}$ Pa. The evaporation rate of organic material in the vacuum vapor deposition is preferably 0.05 to 0.1 nm/s.

Then, a light emitting layer is formed on the hole transport layer or electron blocking layer. The light emitting layer is as described above and will not be reiterated here. The forming process is not specifically limited, as long as it is a well-known process for those skilled in the art. In the present disclosure, the process is preferably a vacuum vapor deposition process. The vacuum degree for the vapor deposition is preferably $1\times10^{-5}$ to $3\times10^{-5}$ Pa. The evaporation rate of blue organic fluorescent material in the vacuum vapor deposition is preferably 0.004 to 0.025 nm/s. The evaporation rate of hole-type organic host material in the vacuum vapor deposition is preferably 0.05 to 0.1 nm/s. The blue organic fluorescent material and the hole-type organic host material in the mixed organic material are evaporated simultaneously from different evaporation sources. The evaporation rates of these two materials are adjusted such that the blue organic fluorescent material is 8.0% to 25.0% by mass of the hole-type organic host material.

According to the present disclosure, a hole blocking layer or electron transport layer is preferably formed on the light emitting layer. The hole blocking layer or electron transport layer is as described above and will not be reiterated here. The forming process is not specifically limited, as long as it is a well-known process for those skilled in the art. In the present disclosure, the process is preferably a vacuum vapor deposition process. The vacuum degree for the vapor deposition is preferably $1\times10^{-5}$ to $3\times10^{-5}$ Pa. The evaporation rate of organic material in the vacuum vapor deposition is preferably 0.05 to 0.1 nm/s.

Then, a buffer layer is preferably formed on the hole blocking layer or electron transport layer. The buffer layer is as described above and will not be reiterated here. The forming process is not specifically limited, as long as it is a well-known process for those skilled in the art. In the present disclosure, the process is preferably a vacuum vapor deposition process. The vacuum degree for the vacuum vapor deposition is preferably $5\times10^{-5}$ to $8\times10^{-5}$ Pa. The evaporation rate is preferably 0.5 to 1.5 nm/s.

Finally, a cathode layer is formed on the buffer layer, thereby obtaining a blue organic electroluminescent device. The cathode layer is as described above, and will not be reiterated here. The forming process is not specifically limited, as long as it is a well-known process for those skilled in the art. In the present disclosure, the process is preferably a vacuum vapor deposition process. The vacuum degree for the vacuum vapor deposition is preferably $5\times10^{-5}$ to $8\times10^{-5}$ Pa.

The blue organic electroluminescent device provided in the present disclosure has a simple structure, which is favorable for simplifying the preparation process of the device. Meanwhile, various functional materials used generally have relatively low prices, which is favorable for lowering the manufacture cost of the device. In addition, all the materials used have good thermostability, which is favorable for improving the device lifetime.

By optimizing the device structure design and simplifying the device structure and the preparation process, the present disclosure improves the efficiency, luminance and operation stability of the device and reduces the manufacture cost of the device, on the premise that it is ensured that the color purity of the device is not reduced.

In order to further illustrate the present disclosure, the blue organic electroluminescent device and the preparation method thereof provided in the present disclosure will be described in detail below with reference to examples.

All reagents used in the following examples are commercially available.

Example 1

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm $MoO_3$ anode interface layer 3 under a vacuum atmosphere of $3\times10^{-5}$ to $5\times10^{-5}$ Pa. Then, the uncompleted device was transferred to an organic vapor deposition chamber to sequentially vapor deposit a TAPC hole transport layer/ electron blocking layer 4 with a thickness of 40 nm, a DBzA doped TcTa light emitting layer 5 with a thickness of 10 nm, and a TmPyPB hole blocking layer/electron transport layer 6 with a thickness of 40 nm on the anode interface layer 3 under a vacuum atmosphere having a vacuum degree of $1\times10^{-5}$ to $3\times10^{-5}$ Pa. Next, the uncompleted device was transferred to a metal vapor deposition chamber to vapor deposit a LiF buffer layer with a thickness of 1.0 nm under a vacuum atmosphere of $3\times10^{-5}$ to $5\times10^{-5}$ Pa. Finally, a metal Al electrode with a thickness of 120 nm was vapor deposited on the LiF layer through a specially-made mask plate to prepare a blue organic electroluminescent device having a structure of ITO/$MoO_3$/TAPC/DBzA (16 wt %):TcTa/TmPyPB/LiF/Al. The evaporation rates for DBzA and TcTa in the light emitting layer 5 were controlled at 0.008 nm/s and 0.05 nm/s, respectively. The evaporation rates for TAPC and TmPyPB were controlled at 0.05 nm/s. The evaporation rate for $MoO_3$ was controlled at 0.01 nm/s. The evaporation rate for LiF was controlled at 0.005 nm/s. The evaporation rate for Al was controlled at 0.5 nm/s.

The blue organic electroluminescent device obtained in Example 1 exhibited a pure blue light emission with a main peak at 462 nm under a direct voltage driving. As the operation voltage varied, the color coordinate of the device was stabilized in a range of from (0.131, 0.133) to (0.146, 0.142). When the luminance was 1000 cd/m$^2$, the color coordinate of the device was (0.135, 0.138).

Figure 2:
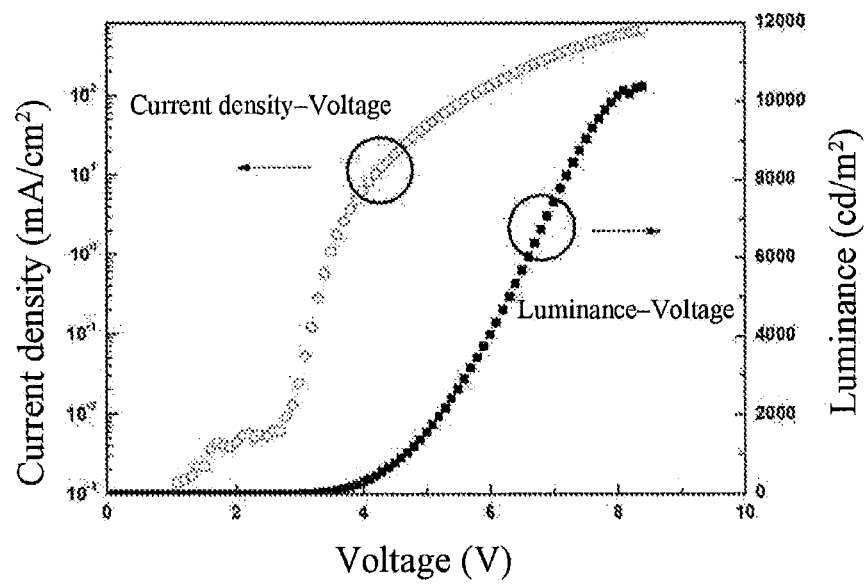
FIG. 2 shows the characteristic curves of voltage-current density-luminance of the blue organic electroluminescent device obtained in Example 1 of the present disclosure. The luminance of the device increases as the current density and the driving voltage increase. The lighting-up voltage of the device is 3.0 volts (V). The maximal luminance of 10384 candelas per square meter ($cd/m^2$) is obtained when the voltage is 8.4 V and the current density is 657.78 milliamperes per square centimeter ($mA/cm^2$).

FIG. 2 shows the curves of voltage-current density-luminance of the blue organic electroluminescent device obtained in Example 1. As seen from FIG. 2, the lighting-up voltage of the device was 3.0 V, and the maximal luminance of the device was 10384 cd/m$^2$.

Figure 3:
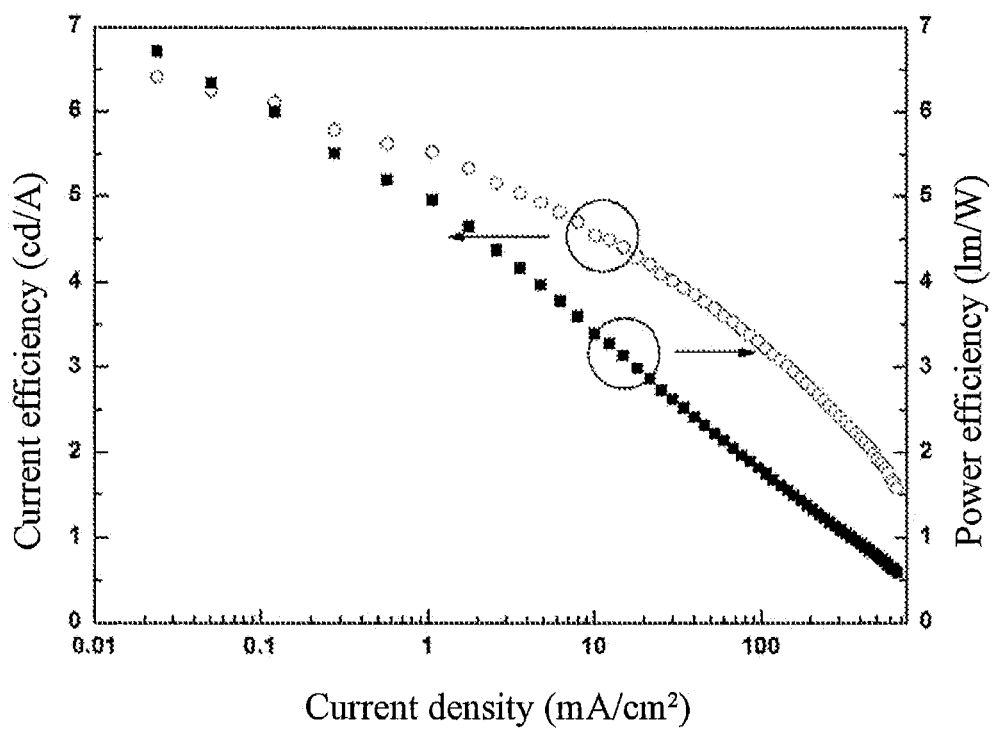
FIG. 3 shows the characteristic curves of current density-power efficiency-current efficiency of the blue organic electroluminescent device obtained in Example 1 of the present disclosure. The maximal current efficiency of the device is 6.41 candelas per ampere (cd/A), and the maximal power efficiency is 6.71 lumens per watt (lm/W).

FIG. 3 shows the characteristic curves of current density-power efficiency-current efficiency of the blue organic electroluminescent device obtained in Example 1. As seen from FIG. 3, the maximal current efficiency of the device is 6.41 cd/A, and the maximal power efficiency is 6.71 lm/W.

Figure 4:
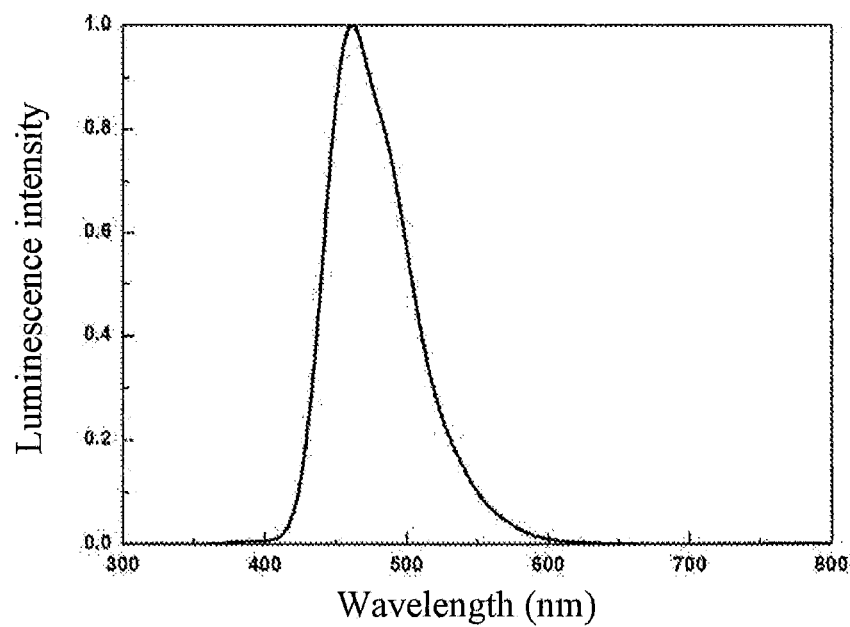
FIG. 4 shows a spectrum of the blue organic electroluminescent device obtained in Example 1 of the present disclosure when the luminance is 1000 $cd/m^2$. The color coordinate of the device is (0.135, 0.138).

FIG. 4 shows a spectrum of the blue organic electroluminescent device obtained in Example 1 when the luminance is 1000 cd/m$^2$. The color coordinate of the device was (0.135, 0.138).

Example 2

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm $MoO_3$ anode interface layer 3 under a vacuum atmosphere of $3\times10^{-5}$ to $5\times10^{-5}$ Pa. Then, the uncompleted device was transferred to an organic vapor deposition chamber to sequentially vapor deposit a TAPC hole transport layer/ electron blocking layer 4 with a thickness of 40 nm, a DBzA doped TcTa light emitting layer 5 with a thickness of 10 nm, and a Tm3PyP26PyB hole blocking layer/electron transport layer 6 with a thickness of 40 nm on the anode interface layer 3 under a vacuum atmosphere having a vacuum degree of $1\times10^{-5}$ to $3\times10^{-5}$ Pa. Next, the uncompleted device was transferred to a metal vapor deposition chamber to vapor deposit a LiF buffer layer with a thickness of 1.0 nm under a vacuum atmosphere of $3\times10^{-5}$ to $5\times10^{-5}$ Pa. Finally, a metal Al electrode with a thickness of 120 nm was vapor deposited on the LiF layer through a specially-made mask plate to prepare a blue organic electroluminescent device having a structure of ITO/$MoO_3$/TAPC/DBzA (15 wt %):TcTa/Tm3PyP26PyB/LiF/Al. The evaporation rates for DBzA and TcTa in the light emitting layer 5 were controlled at 0.0075 nm/s and 0.05 nm/s, respectively. The evaporation rates for TAPC and TmPyPB were controlled at 0.05 nm/s. The evaporation rate for $MoO_3$ was controlled at 0.01 nm/s. The evaporation rate for LiF was controlled at 0.005 nm/s. The evaporation rate for Al was controlled at 0.5 nm/s.

The blue organic electroluminescent device obtained in Example 2 exhibited a pure blue light emission with a main peak at 462 nm under a direct voltage driving. As the operation voltage varied, the color coordinate of the device was stabilized in a range of from (0.133, 0.132) to (0.144, 0.143). When the luminance was 1000 cd/m$^2$, the color coordinate of the device was (0.136, 0.134).

Figure 5:
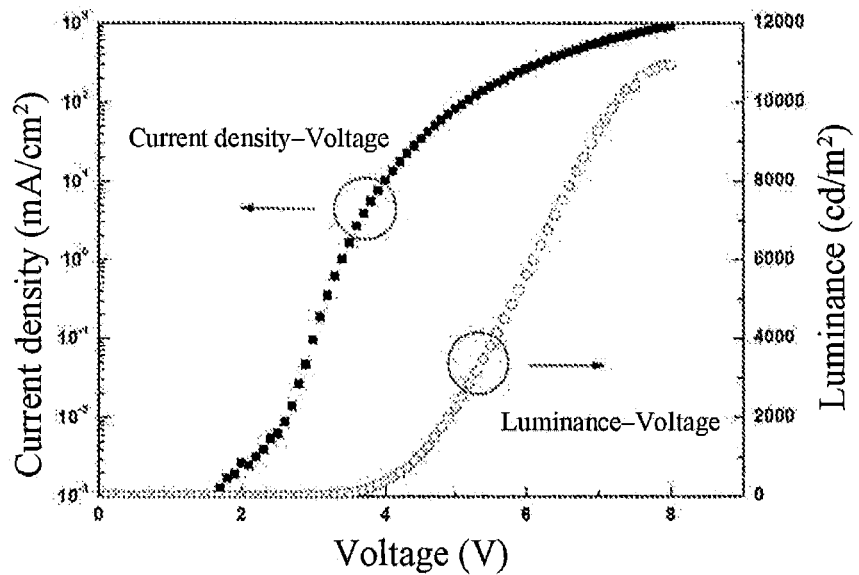
FIG. 5 shows the characteristic curves of voltage-current density-luminance of the blue organic electroluminescent device obtained in Example 2 of the present disclosure. The luminance of the device increases as the current density and the driving voltage increase. The lighting-up voltage of the device is 2.8 V. The maximal luminance of 10937 $cd/m^2$ is obtained when the voltage is 8.0 V and the current density is 910.09 $mA/cm^2$.

FIG. 5 shows the curves of voltage-current density-luminance of the blue organic electroluminescent device obtained in Example 2. As seen from FIG. 5, the luminance of the device increased as the current density and the driving voltage increased, the lighting-up voltage of the device was 2.8 V, and the maximal luminance of the device was 10937 cd/m$^2$.

Figure 6:
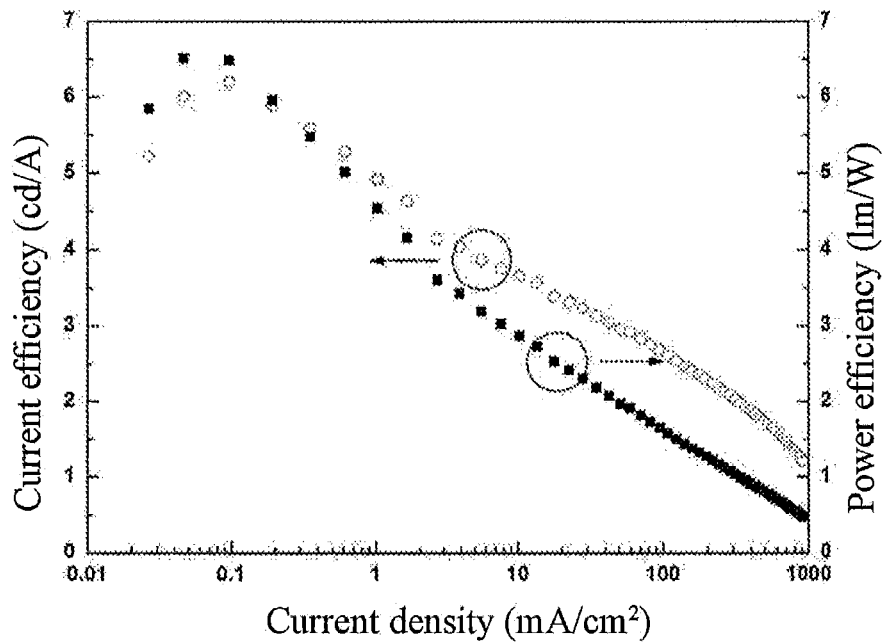
FIG. 6 shows the characteristic curves of current density-power efficiency-current efficiency of the blue organic electroluminescent device obtained in Example 2 of the present disclosure. The maximal current efficiency of the device is 6.19 cd/A, and the maximal power efficiency is 6.51 lm/W.

FIG. 6 shows the characteristic curves of current density-power efficiency-current efficiency of the blue organic electroluminescent device obtained in Example 2. As seen from FIG. 6, the maximal current efficiency of the device is 6.19 cd/A, and the maximal power efficiency is 6.51 lm/W.

Example 3

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm $MoO_3$ anode interface layer 3 under a vacuum atmosphere of $3\times10^{-5}$ to $5\times10^{-5}$ Pa. Then, the uncompleted device was transferred to an organic vapor deposition chamber to sequentially vapor deposit a TAPC hole transport layer/electron blocking layer 4 with a thickness of 50 nm, a DBzA doped TcTa light emitting layer 5 with a thickness of 10 nm, and a TmPyPB hole blocking layer/electron transport layer 6 with a thickness of 50 nm on the anode interface layer 3 under a vacuum atmosphere having a vacuum degree of $1\times10^{-5}$ to $3\times10^{-5}$ Pa. Next, the uncompleted device was transferred to a metal vapor deposition chamber to vapor deposit a LiF buffer layer with a thickness of 1.0 nm under a vacuum atmosphere of $3\times10^{-5}$ to $5\times10^{-5}$ Pa. Finally, a metal Al electrode with a thickness of 120 nm was vapor deposited on the LiF layer through a specially-made mask plate to prepare a blue organic electroluminescent device having a structure of ITO/$MoO_3$/TAPC/DBzA (16 wt %):TcTa/TmPyPB/LiF/Al. The evaporation rates for DBzA and TcTa in the light emitting layer 5 were controlled at 0.008 nm/s and 0.05 nm/s, respectively. The evaporation rates for TAPC and TmPyPB were controlled at 0.05 nm/s. The evaporation rate for $MoO_3$ was controlled at 0.01 nm/s. The evaporation rate for LiF was controlled at 0.005 nm/s. The evaporation rate for Al was controlled at 0.5 nm/s.

The blue organic electroluminescent device obtained in Example 3 exhibited a pure blue light emission with a main peak at 462 nm under a direct voltage driving. As the operation voltage varied, the color coordinate of the device was stabilized in a range of from (0.135, 0.136) to (0.141, 0.149). When the luminance was 1000 cd/m², the color coordinate of the device was (0.137, 0.140). The lighting-up voltage of the device was 3.1 V, and the maximal luminance of the device was 11056 cd/m². The maximal current efficiency of the device is 6.46 cd/A, and the maximal power efficiency is 6.54 lm/W.

Example 4

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm $MoO_3$ anode interface layer 3 under a vacuum atmosphere of $3\times10^{-5}$ to $5\times10^{-5}$ Pa. Then, the uncompleted device was transferred to an organic vapor deposition chamber to sequentially vapor deposit a TAPC hole transport layer/electron blocking layer 4 with a thickness of 50 nm, a DBzA doped TcTa light emitting layer 5 with a thickness of 10 nm, and a TmPyPB hole blocking layer/electron transport layer 6 with a thickness of 40 nm on the anode interface layer 3 under a vacuum atmosphere having a vacuum degree of $1\times10$ to $3\times10^{-5}$ Pa. Next, the uncompleted device was transferred to a metal vapor deposition chamber to vapor deposit a LiF buffer layer with a thickness of 1.0 nm under a vacuum atmosphere of $3\times10^{-5}$ to $5\times10^{-5}$ Pa. Finally, a metal Al electrode with a thickness of 120 nm was vapor deposited on the LiF layer through a specially-made mask plate to prepare an organic electroluminescent device having a structure of ITO/$MoO_3$/TAPC/DBzA (16 wt %):TcTa/TmPyPB/LiF/Al. The evaporation rates for DBzA and TcTa in the light emitting layer 5 were controlled at 0.008 nm/s and 0.05 nm/s, respectively. The evaporation rates for TAPC and TmPyPB were controlled at 0.05 nm/s. The evaporation rate for $MoO_3$ was controlled at 0.01 nm/s. The evaporation rate for LiF was controlled at 0.005 nm/s. The evaporation rate for Al was controlled at 0.5 nm/s.

The blue organic electroluminescent device obtained in Example 4 exhibited a pure blue light emission with a main peak at 462 nm under a direct voltage driving. As the operation voltage varied, the color coordinate of the device was stabilized in a range of from (0.131, 0.130) to (0.145, 0.141). When the luminance was 1000 cd/m², the color coordinate of the device was (0.132, 0.137). The lighting-up voltage of the device was 3.0 V, and the maximal luminance of the device was 11296 cd/m². The maximal current efficiency of the device is 6.23 cd/A, and the maximal power efficiency is 6.52 lm/W.

Example 5

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm $MoO_3$ anode interface layer 3 under a vacuum atmosphere of $3\times10^{-5}$ to $5\times10^{-5}$ Pa. Then, the uncompleted device was transferred to an organic vapor deposition chamber to sequentially vapor deposit a TAPC hole transport layer/electron blocking layer 4 with a thickness of 40 nm, a DBzA doped TcTa light emitting layer 5 with a thickness of 10 nm, and a TmPyPB hole blocking layer/electron transport layer 6 with a thickness of 50 nm on the anode interface layer 3 under a vacuum atmosphere having a vacuum degree of $1\times10^{-5}$ to $3\times10^{-5}$ Pa. Next, the uncompleted device was transferred to a metal vapor deposition chamber to vapor deposit a LiF buffer layer with a thickness of 1.0 nm under a vacuum atmosphere of $3\times10^{-5}$ to $5\times10^{-5}$ Pa. Finally, a metal Al electrode with a thickness of 120 nm was vapor deposited on the LiF layer through a specially-made mask plate to prepare a blue organic electroluminescent device having a structure of ITO/$MoO_3$/TAPC/DBzA (16 wt %):TcTa/TmPyPB/LiF/Al. The evaporation rates for DBzA and TcTa in the light emitting layer 5 were controlled at 0.008 nm/s and 0.05 nm/s, respectively. The evaporation rates for TAPC and TmPyPB were controlled at 0.05 nm/s. The evaporation rate for $MoO_3$ was controlled at 0.01 nm/s. The evaporation rate for LiF was controlled at 0.005 nm/s. The evaporation rate for Al was controlled at 0.5 nm/s.

The blue organic electroluminescent device obtained in Example 5 exhibited a pure blue light emission with a main peak at 462 nm under a direct voltage driving. As the operation voltage varied, the color coordinate of the device was stabilized in a range of from (0.135, 0.133) to (0.148, 0.146). When the luminance was 1000 cd/m², the color coordinate of the device was (0.139, 0.141). The lighting-up voltage of the device was 2.9 V, and the maximal luminance of the device was 9885 cd/m². The maximal current efficiency of the device is 6.32 cd/A, and the maximal power efficiency is 6.84 lm/W.

Example 6

An ITO anode layer on an ITO glass was laser-etched into a patterned electrode, then ultrasonically washed with a cleaning liquid and deionized water sequentially for 15 min, and placed in an oven for drying. The dried substrate was then placed in a pretreating vacuum chamber. The ITO anode was subjected to a low-pressure oxygen plasma treatment for 10 min under an atmosphere having a vacuum degree of 10 Pa with a voltage of 400 V, and then transferred to a metal vapor deposition chamber to vapor deposit 3 nm $MoO_3$ anode interface layer 3 under a vacuum atmosphere of $3\times10^{-5}$ to $5\times10^{-5}$ Pa. Then, the uncompleted device was transferred to an organic vapor deposition chamber to sequentially vapor deposit a TAPC hole transport layer/electron blocking layer 4 with a thickness of 50 nm, a DBzA doped TcTa light emitting layer 5 with a thickness of 10 nm, and a TmPyPB hole blocking layer/electron transport layer 6 with a thickness of 50 nm on the anode interface layer 3 under a vacuum atmosphere having a vacuum degree of $1\times10^{-5}$ to $3\times10^{-5}$ Pa. Next, the uncompleted device was transferred to a metal vapor deposition chamber to vapor deposit a LiF buffer layer with a thickness of 1.0 nm under a vacuum atmosphere of $3\times10^{-5}$ to $5\times10^{-5}$ Pa. Finally, a metal Al electrode with a thickness of 120 nm was vapor deposited on the LiF layer through a specially-made mask plate to prepare an organic electroluminescent device having a structure of ITO/$MoO_3$/TAPC/DBzA (15 wt %):TcTa/TmPyPB/LiF/Al. The evaporation rates for DBzA and TcTa in the light emitting layer 5 were controlled at 0.0075 nm/s and 0.05 nm/s, respectively. The evaporation rates for TAPC and TmPyPB were controlled at 0.05 nm/s. The evaporation rate for $MoO_3$ was controlled at 0.01 nm/s. The evaporation rate for LiF was controlled at 0.005 nm/s. The evaporation rate for Al was controlled at 0.5 nm/s, The blue organic electroluminescent device obtained in Example 6 exhibited a pure blue light emission with a main peak at 462 nm under a direct voltage driving. As the operation voltage varied, the color coordinate of the device was stabilized in a range of from (0.130, 0.135) to (0.142, 0.148). When the luminance was 1000 cd/m², the color coordinate of the device was (0.137, 0.143). The lighting-up voltage of the device was 3.0 V, and the maximal luminance of the device was 10656 cd/m². The maximal current efficiency of the device is 6.28 cd/A, and the maximal power efficiency is 6.57 lm/W.

The invention claimed is:

1. A blue organic electroluminescent device, comprising:
   a substrate;
   an anode layer on the substrate;
   a light emitting layer on the anode layer, the light emitting layer comprising a blue organic fluorescent material and a hole-type organic host material, wherein the blue organic fluorescent material is 8.0% to 25.0% by mass of the hole-type organic host material, and an excited state energy of the blue organic fluorescent material is lower than an excited state energy of the hole-type organic host material; and
   a cathode layer on the light emitting layer.

2. The blue organic electroluminescent device according to claim 1, wherein the blue organic fluorescent material is 2,2'-(9,10-anthracenediyl-di-4,1-phenylene)bis[6-methyl-benzothiazole].

3. The blue organic electroluminescent device according to claim 1, wherein the hole-type organic host material is one or more selected from the group consisting of 4,4'-di(9-carbazolyl)biphenyl, 1,3-di(carbazol-9-yl)benzene, 9,9'-(5-(triphenylsilyl)-1,3-phenylene)bis-9H-carbazole, 1,3,5-tri(9-carbazolyl)benzene, 4,4',4''-tri(carbazol-9-yl)triphenylamine and 4,4'-bis(triphenylsilyl)biphenyl.

4. The blue organic electroluminescent device according to claim 1, wherein the light emitting layer has a thickness of from 5 to 20 nm.

5. The blue organic electroluminescent device according to claim 1, further comprising an anode interface layer between the anode layer and the light emitting layer, wherein the anode interface layer has a thickness of from 2 to 10 nm.

6. The blue organic electroluminescent device according to claim 1, further comprising a hole transport layer or electron blocking layer between the anode layer and the light emitting layer, wherein the hole transport layer or electron blocking layer has a thickness of from 40 to 60 nm.

7. The blue organic electroluminescent device according to claim 1, wherein a hole blocking layer or electron transport layer is further disposed between the light emitting layer and the cathode layer, wherein the hole blocking layer or electron transport layer has a thickness of from 40 to 60 nm.

8. The blue organic electroluminescent device according to claim 7, further comprising a buffer layer between the hole blocking layer or electron transport layer and the cathode layer, wherein the buffer layer has a thickness of from 0.8 to 1.2 nm.

9. A preparation method of a blue organic electroluminescent device, the method comprising the steps of:
   forming an anode layer on a substrate;
   forming a light emitting layer on the anode layer, the light emitting layer being formed from a blue organic fluorescent material and a hole-type organic host material, wherein the blue organic fluorescent material is 8.0% to 25.0% by mass of the hole-type organic host material, and an excited state energy of the blue organic fluorescent material is lower than an excited state energy of the hole-type organic host material; and
   forming a cathode on the light emitting layer, thereby obtaining the blue organic electroluminescent device.

10. The preparation method according to claim 9, wherein the blue organic fluorescent material is 2,2'-(9,10-anthracenediyl-di-4,1-phenylene)bis[6-methyl-benzothiazole].

11. The preparation method according to claim 9, wherein the hole-type organic host material is one or more selected from the group consisting of 4,4'-di(9-carbazolyl)biphenyl, 1,3-di(carbazol-9-yl)benzene, 9,9'-(5-(triphenylsilyl)-1,3-phenylene)bis-9H-carbazole, 1,3,5-tri(9-carbazolyl)benzene, 4,4',4''-tri(carbazol-9-yl)triphenylamine and 4,4'-bis(triphenylsilyl)biphenyl.

* * * * *

UNITED STATES PATENT AND TRADEMARK OFFICE
CERTIFICATE OF CORRECTION

| | | |
|---|---|---|
| PATENT NO. | : 10,854,820 B2 | Page 1 of 1 |
| APPLICATION NO. | : 16/477282 | |
| DATED | : December 1, 2020 | |
| INVENTOR(S) | : Zhou et al. | |

It is certified that error appears in the above-identified patent and that said Letters Patent is hereby corrected as shown below:

On the Title Page

(30) Foreign Application Priority Data:
Please correct "2017 1 0032259" to read -- 2017 1 0032259.8 --

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*